United States Patent [19]

Hagino et al.

[11] Patent Number: 4,959,344
[45] Date of Patent: Sep. 25, 1990

[54] METHOD OF MANUFACTURING SUPERCONDUCTIVE COIL BY EXPLOSIVE COMPACTION

[75] Inventors: Sadaaki Hagino; Motokazu Suzuki; Takuo Takeshita, all of Ohmiya; Hideki Tonda; Kazuki Takashima, both of Kumamoto, all of Japan

[73] Assignee: Mitsubishi Metal Corporation, Tokyo, Japan

[21] Appl. No.: 373,943

[22] Filed: Jun. 29, 1989

[30] Foreign Application Priority Data

Jul. 4, 1988 [JP] Japan .............................. 63-166366
Jul. 4, 1988 [JP] Japan .............................. 63-166367

[51] Int. Cl.$^5$ ........................ H01L 39/12; H01L 5/08; H01L 39/24
[52] U.S. Cl. .................... 505/1; 505/704; 505/705; 505/740; 428/389; 174/125.1; 29/599
[58] Field of Search ................. 505/815, 809, 1, 704, 505/705, 740; 419/5, 20, 23, 29, 38, 51; 428/552, 389; 174/125.1; 29/599

[56] References Cited

U.S. PATENT DOCUMENTS

| | | | |
|---|---|---|---|
| 3,752,665 | 8/1973 | Roy et al. .............................. | 75/135 |
| 4,762,754 | 8/1988 | Nellis et al. ........................... | 428/552 |
| 4,843,059 | 6/1989 | DeSlandes et al. .................... | 505/1 |

OTHER PUBLICATIONS

Murr et al., "Shock Compression Fabrication of High-Temperature Superconductor/Metal Composite Monoliths", Nature, vol. 329, Sep. 3, 1987.

"Structural, Electrical and Magnetic Properties of High-$T_c$ Bi–Sr–Ca–Cu–O Superconductors", vol. 8, No. 4, 4/1989, Material Science.

"Computer Simulation of Dynamic Compaction", Mark L. Wilkins and Carl F. Cline, *Explosive Compaction*.

*Primary Examiner*—Stephen J. Lechert, Jr.
*Assistant Examiner*—Nina Bhat
*Attorney, Agent, or Firm*—Frishauf, Holtz, Goodman & Woodward

[57] ABSTRACT

A method of manufacturing a superconductive coil by means of explosive compaction. A wire formed of silver having a superconductive oxide powder charged therein is formed into a coil. The coil is placed within a cylindrical vessel, into which a pressure medium is charged. Explosive compaction is carried out to cause the compaction of the coil through the cylindrical vessel and the pressure medium and hence densify the coil. The compacted coil is heat-treated in an air or oxygen atmosphere. The resulting superconductive coil possesses high critical electric current density. Advantageously, the coil is mounted on a mandrel axially extending therethrough, and placed together with the mandrel into the cylindrical vessel, before explosive compaction.

18 Claims, 6 Drawing Sheets

METHOD OF MANUFACTURING SUPERCONDUCTIVE COIL BY EXPLOSIVE COMPACTION

BACKGROUND OF THE INVENTION

This invention relates to a method of manufacturing a superconductive coil possessing high critical electric current density by explosive compaction.

It is generally known that chemical compounds having a perovskite structure formed of rare earth elements (hereinafter abbreviated as "R") including yttrium, alkali earth metals, copper, and oxygen (hereinafter referred to as "R-based oxides) exhibit superconductivity at a temperature of approximately 77° K., to which they can be cooled by means of liquid nitrogen.

Conventionally, a superconductive coil has been manufactured from a powder of an R-based oxide in the following manner: An $R_2O_3$ powder, an alkali earth metal carbonate powder, and a copper oxide (CuO) powder are used as starting materials, each having a mean particle size of 10 microns or less. The starting material powders are used in predetermined proportions, and mixed, and the resulting mixture is sintered in an air or oxygen atmosphere at a temperature within a range from 850° to 950° C. into a sintered body of the R-based oxide having a perovskite structure. The R-based oxide sintered body is crushed into a powder having a mean particle size of 10 microns or less to obtain an R-based oxide powder. The R-based oxide powder is charged into a tube formed of silver, and then the opposite ends of the tube are closed. The tube is then subjected to drawing, e.g., by means of swaging, rolling with a grooved roll, or die drawing, into a composite wire of the R-based oxide and silver with an outer diameter of 5 mm or less. The composite wire is then formed into a coil, and then heat-treated in an air or oxgen atmosphere at a temperature within a range from 900 to 950° C. to obtain an R-based oxide superconductive coil.

Further, it has recently been found that Bi-Ca-Sr-Cu-O oxides (hereinafter referred to as "Bi-based oxides"), and Tl-Ca-Ba-Cu-O oxides (hereinafter referred to as "Tl-based oxides") exhibit superconductivity at a temperature of 77° K. or higher, to which they can be cooled by means of liquid nitrogen.

To obtain a Bi-based oxide for a Bi-based oxide superconducting coil, first a $Bi_2O_3$ powder, a $CaCO_3$ powder, an $SrCO_3$ powder, and a CuO powder are used as starting material powders. The starting material powders are used in predetermined proportions, and mixed, and the resulting mixture is sintered in an air or oxygen atmosphere at a temperature within a range of 700° to 800° C. for 4 to 12 hours. On the other hand, to obtain a Tl-based oxide, a $Tl_2O_3$ powder, a $CaCO_3$ powder, a $BaCO_3$ powder, and a CuO powder are used as starting material powders. The starting material powders are used in predetermined proportions, and mixed, and the resulting mixture is sintered in an air or oxygen atmosphere at a temperature within a range of 600° to 700° C. for 4 to 12 hours.

The Bi-based oxide or Tl-based oxide thus obtained is crushed into a Bi-based oxide powder or Tl-based oxide powder having a mean particle size of 5 microns or less. The obtained Bi-based oxide powder or Tl-based oxide powder is charged into a silver tube, and then the opposite ends of the tube are closed. The tube is then subjected to drawing into a composite wire of the Bi-based oxide and silver or a composite wire of the Tl-based oxide and silver with an outer diameter of 5 mm or less. The obtained composite wire is formed into a coil, and heat-treated in an air or oxgen atmosphere to obtain an Bi-based oxide superconductive coil or a Tl-based oxide superconductive coil, wherein the heat-treatment temperature ranges from 830° to 870° C. for the Bi-based superconductive coil or from 880° to 920° C. for the Tl-based superconductive coil.

The conventional superconductive coils have insufficient critical electric current densities for practical use in various electrical apparatus. That is, the R-based oxide superconductive coil has a critical electric current density of about $700 A/cm^2$ at the most, the Bi-based oxide superconductive coil about $100 A/cm^2$ at the most, and the Tl-system oxide superconductive coil about $180 A/cm^2 t$ at the most. Under the situation, there is a demand for development of a superconductive coil which has higher critical electric current density.

To meet the demand, it has been proposed to subject an R-based oxide superconductive coil, a Bi-based oxide superconductive coil, or a Tl-based oxide superconductive coil to explosive compaction so as to increase the density of the oxide powder within the coil and hence the critical electric current density of the superconductive coil. However, according to the proposal, since the coil is directly subjected to explosive compaction, it can be heavily deformed or even broken during explosion. Thus, the conventional superconductive coils do not meet the requirements for practical use in the above-mentioned apparatus.

SUMMARY OF THE INVENTION

It is therefore an object of the invention to provide a method of manufacturing, by means of explosive compaction, a superconductive coil which possesses sufficient or high critical electric current density for use in electrical apparatus.

A further object of the invention is to provide a method of manufacturing, by means of explosive compaction, a superconductive coil which retains a proper form of a coil without deformation or breakage, and also possesses a uniform density of the superconductive oxide within the coil.

According to a first aspect of the invention, there is provided a method of manufacturing a superconductive coil by means of explosive compaction by forming a coil from a wire formed of silver having a superconductive oxide powder charged therein, subjecting the coil to explosive compaction to densify the coil, and heat-treating the coil thus densified in an air or oxygen atmosphere.

The method according to the first aspect of the invention is characterized by the following steps:

(1) placing the coil within a cylindrical vessel and charging a pressure medium into the cylindrical vessel; and (2) carrying out the explosive compaction to cause compaction of the coil through the cylindrical vessel and the pressure medium and hence densify the coil.

Preferably, the coil may be placed within the cylindrical vessel at a central location thereof.

More preferably, the pressure medium may comprise a powder which has a mean particle size within a range from 1 to 1000 microns and is not solidified by the explosive compaction.

The pressure medium may comprise fluid.

The superconductive oxide powder may be a powder of an oxide having a perovskite structure formed of at least one of rare earth elements and yttrium, at least one of alkali earth metals, copper, and oxygen.

The superconductive oxide powder may be a powder of Bi-Ca-Sr-Cu-0 oxide.

The superconductive oxide powder may be a powder of Tl-Ca-Ba-Cu-0 oxide.

The cylindrical vessel may be formed of one material selected from the group consisting of metal, an alloy thereof, synthetic resin, glass, ceramic, and cardboard.

According to a second aspect of the invention, there is provided a method of manufacturing a superconductive coil by means of explosive compaction by forming a coil from a wire formed of silver having a superconductive oxide powder charged therein, carrying out explosive compaction to densify the coil, and heat-treating the coil thus densified in an air or oxygen atmosphere.

The method according to the second aspect of the invention is characterized by the following steps:

(1) mounting the coil on a mandrel axially extending therethrough;

(2) placing the coil mounted on the mandrel within a cylindrical vessel and charging a pressure medium into the cylindrical vessel; and (3) carrying out the explosive compaction to cause compaction of the coil through the cylindrical vessel, the pressure medium, and the mandrel and hence densify the coil.

Preferably, the coil may be placed within the cylindrical vessel such that the coil has an axis thereof in alignment with axes of the mandrel, and the vessel.

More preferably, the pressure medium may comprise a powder which has a mean particle size within a range from 1 to 1000 microns and is not solidified by the explosive compaction.

The pressure medium may comprise fluid.

The mandrel may be formed of metal.

The mandrel may be formed of ceramic.

The superconductive oxide powder may be a powder of an oxide having a perovskite structure formed of at least one of rare earth elements and yttrium, at least one of alkali earth metals, copper, and oxygen.

The superconductive oxide powder may be a powder of Bi-Ca-Sr-Cu-0 oxide.

The superconductive oxide powder may be a powder of Tl-Ca-Ba-Cu-0 oxide.

The cylindrical vessel may be formed of one material selected from the group consisting of metal, an alloy thereof, synthetic resin, glass, ceramic, and cardboard.

The above and other objects, features and advantages of the invention will be more apparent from the ensuing detailed description taken in conjunction with the accompanying drawings.

DETAILED DESCRIPTION

We have made many studies in order to obtain a superconductive coil which possesses sufficient critical electric current density for practical use, to reach the following findings:

(1) If a coil charged with the R-based oxide, a coil charged with the Bi-based oxide, or a coil charged with Tl-based oxide is placed within a cylindrical vessel in which a pressure medium is filled, and subjected to explosive compaction, the resulting superconductive coil has a high charging density of superconductive oxide powder without being deformed or broken and hence possesses very high critical electric current density.

(2) If a coil charged with the R-based oxide, a coil charged with the Bi-based oxide, or a coil charged with Tl-based oxide is placed within a cylindrical vessel in which a pressure medium is filled, in a manner being disposed around a mandrel extending therethrough, and subjected to explosive compaction, the resulting superconductive coil possesses further increased critical electric current density.

The present invention is based upon the above findings.

The invention will now be described in detail with reference to the drawings showing embodiments thereof.

Figure 1:
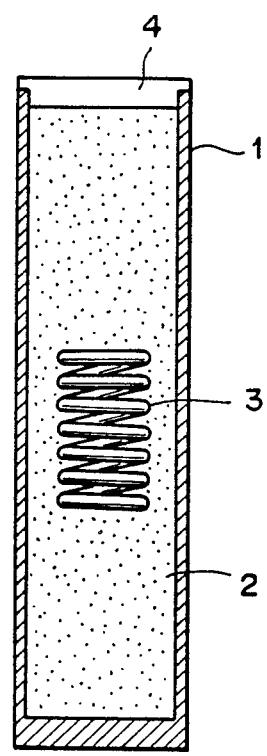
FIG. 1 is a longitudinal cross-sectional view of a complete cylindrical vessel used for carrying out explosive compaction, according to a first embodiment of the invention.

FIG. 1 shows an arrangement for manufacturing a superconductive coil according to a first embodiment of the invention.

In the figure, reference numeral 1 designates a bottomed cylindrical vessel, which is preferably formed of a metal such as steel, aluminum, and an alloy thereof. The cylindrical vessel 1 may be formed of plastic or synthetic resin, glass, ceramic, or cardboard in place of metal. A coil 3 having a superconductive oxide charged therein is axially placed within the cylindrical vessel 1 at a central location thereof and at the same time a pressure medium 2 is charged into the vessel 1. The pressure medium 2 is a powder of solid particles formed of a material which does not become solidified i.e., does not melt to agglomerate, by explosive compaction of the cylindrical vessel 1, e.g., an SiC powder, an $Al_2O_3$ powder, or a TiN powder, preferably having a mean particle size within a range from 1 to 1000 microns. Advantageously, after a batch of pressure medium 2 is charged into the vessel 1 together with the coil 3, the vessel 1 is vibrated to make the pressure medium 2 denser, and then an additional amount of medium 2 is charged. After the charging, a cap 4 is fitted into an open or charging end of the vessel 1 to close same.

Figure 3:
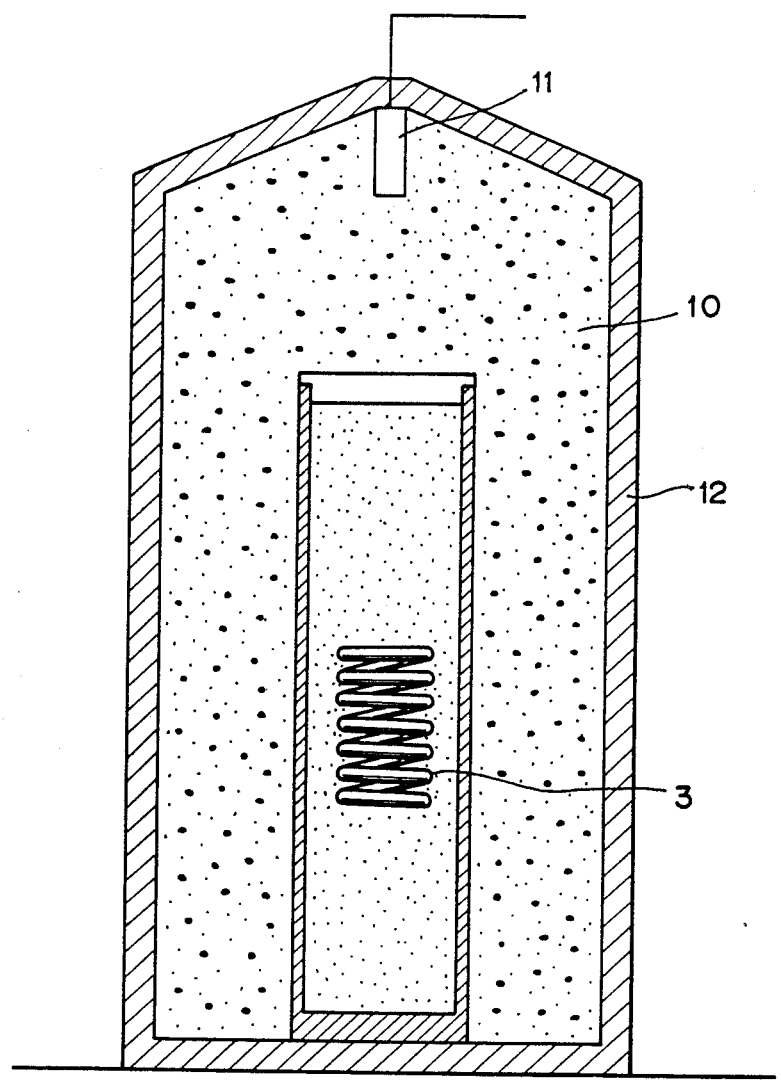
FIG. 3 is a longitudinal cross-sectional view of the vessel of FIG. 1 placed within a cardboard vessel with an explosion triggering device.

The completed cylindrical vessel 1 is placed into a vessel 12 formed of a cardboard, followed by charging an explosive 10 which is a powdered explosive into the vessel 12, as shown in FIG. 3. An explosion triggering device 11 is arranged in the cardboard vessel 12 at a central top thereof to cause explosion of the explosive 10. Upon explosion of the explosive 10, the cylindrical vessel 1 is forcedly compacted and hence the coil 3 is forcedly compacted through the pressure medium 2. The coil 3 thus compacted by the explosion has a uniform degree of compaction throughout the whole body and is free of deformation and breakage so that the superconductive oxide within the coil 3 is evenly compacted to a higher degree.

Figure 2:
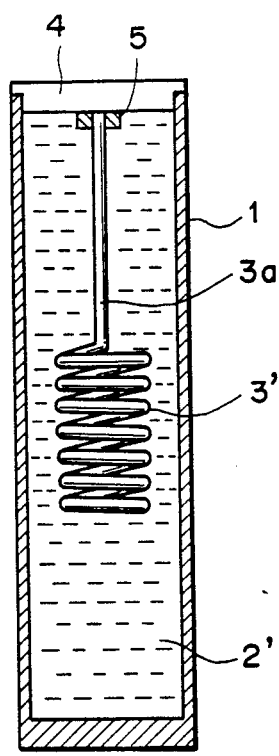
FIG. 2 is a view similar to FIG. 1, showing a variation of the FIG. 1 embodiment, wherein a liquid pressure medium is used in place of a powdery pressure medium.

As shown in FIG. 2, a fluid pressure medium 2' such as water and oil may be used in place of the powdered pressure medium 2 shown in FIG. 1, insofar as the cylindrical vessel 1 is sealed in a liquid-tight manner by the cap 4, though the powdered pressure medium 2 is easier to handle. if a liquid pressure medium is used, the coil 3' should have a straight end portion 3a, for example, supported by a chuck provided on an inner end face of the cap 4 at a diametrically central portion thereof so that the remainder of the coil 3' is placed at a central portion of the cylindrical vessel 1 filled with the fluid pressure medium 2'.

After the cylindrical vessel 1 has been explosively compacted, the coil 3 is removed from the cylindrical vessel 1 and heat-treated in an air or oxygen atmosphere. Thus, a superconductive coil can be obtained, which possesses sufficiently high critical electric current density.

Specific examples of the pressure medium 2 which does not become solidified even by explosive compaction may be the following powders;

A powder of oxide such as $Al_2O_3$, $SiO_2$, MgO, or $ZrO_2$, or a double oxide thereof;

A powder of nitride such as AlN or $Si_3N_4$;

A powder of boride such as $TiB_2$, $ZrB_3$, or MoB;

A powder of carbide such as TiC, SiC, ZrC, or WC, or a solid solution thereof;

A powder of silicide such as $MoSi_2$, TiSi, or ZrSi; and

A powder of carbo-nitride, carbo-silicide, and carbo-boride of the above materials.

A solid plastic explosive may be used in place of the powdered explosive 10, and wherein the cardboard vessel 10 can be omitted.

Figure 4:
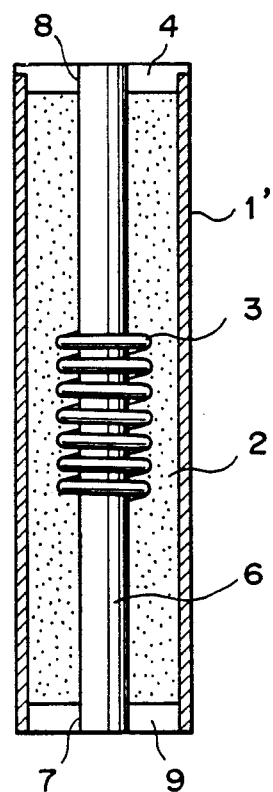
FIG. 4 is a view similar to FIG. 1, showing a second embodiment of the invention.
Figure 5:
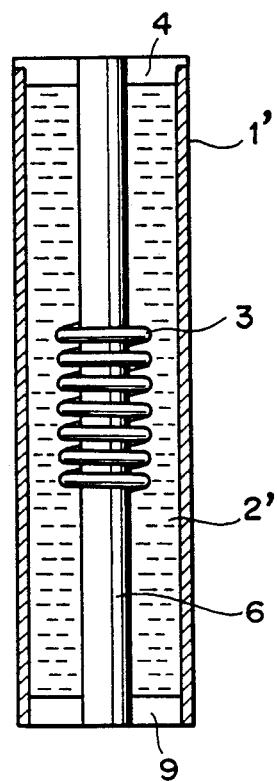
FIG. 5 is a view similar to FIG. 2, according to the second embodiment of the invention.
Figure 6:
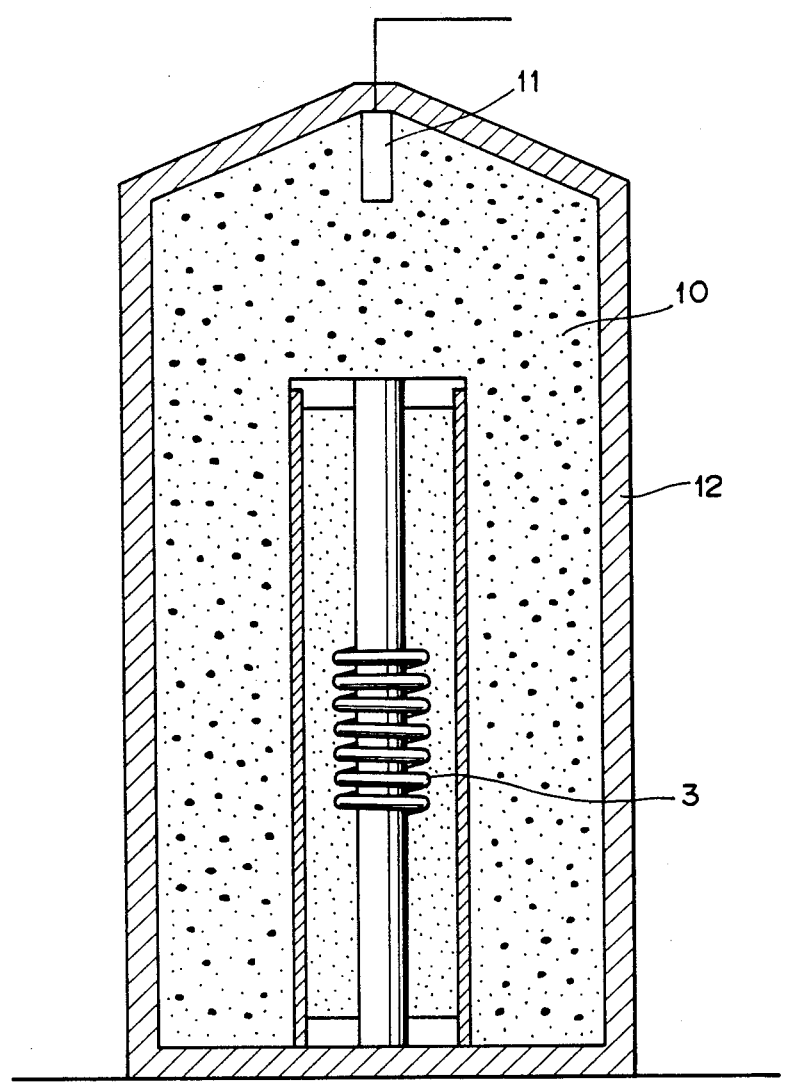
FIG. 6 is a view similar to FIG. 3, according to the second embodiment of the invention.

FIGS. 4 through 6 show an arrangement for manufacturing a superconductive coil according to a second embodiment of the invention.

The second embodiment is different from the first embodiment in that a rod-shaped mandrel is employed, which extends through the coil.

A cylindrical vessel 1' has opposite open ends, in a lower one of which is fitted an end plug 9, which has an axial central through bore 7 formed therein with a diameter almost equal to the outer diameter of the mandrel 6. The end plug 9 may be fitted into the lower open end of the cylindrical vessel 1' by driving, screwing, welding, or adhesion. On the other hand, a coil 3 is concentrically mounted on the mandrel 6 extending therethrough, i.e., such that the axis of the former is aligned with the axis of the latter. Then, one end of the mandrel 6 with the coil 3 mounted thereon is fitted into the axial bore 7 of the end plug 9 forming the bottom of the cylindrical vessel 1'. To fix the coil 3 on the mandrel 6, two radial holes, not shown, which have a diameter equal to that of the opposite ends of the coil 3, may be formed in an outer peripheral surface of the mandrel 6, into which corresponding ends of the coil 3 are inserted. Alternatively, the coil 3 may be fixed on the mandrel 6 by means of adhesive, an adhesive tape, or the like.

After the mandrel 6 has been fitted into the end plug 2, a powdered pressure medium 2 formed of a powder of solid particles is charged into the cylindrical vessel 1', followed by properly vibrating the cylindrical vessel 1' and further additionally charging the medium 2, similarly to the first embodiment. Then a cap 4 having an axial through bore 8 formed therein is fitted into the upper open end of the vessel 1' while inserting the other end of the mandrel 6 into the axial through bore 8.

The completed cylindrical vessel 1' is placed into a cardboard vessel 12 having an explosion triggering device 11 at a central top thereof, followed by charging an explosive 10 into the vessel 12, in a manner similar to the first embodiment, as shown in FIG. 6. Then the explosive 10 is exploded by means of the explosion triggering device 11.

After the explosion, the coil 3 is removed from the cylindrical vessel 1' and heat-treated in an air or oxygen atmosphere under the same conditions as described with reference to the first embodiment. Thus, a superconductive coil can be obtained, which possesses high critical electric current density.

To evenly compact the coil 3 throughout the whole body thereof by the explosion, the coil 3 should be placed in the cylindrical vessel 1' such that the axis of the coil 3 is aligned with the axis of the mandrel 6. This is because it is considered that a shock wave caused within the cylindrical vessel 1' by the explosion is propagated from the inner peripheral surface of the vessel 1' toward a diametrically central portion of the vessel 1' and then reflected by the outer peripheral surface of the mandrel 6 to apply high impact pressure to the coil 3, at a radially inner side thereof. That is, the coil 3 is given impact pressure not only in the radially outward direction but also in the radially inward direction, thereby greatly increasing the density of the superconductive oxide powder within the coil 3. However, if the axis of the coil 3 is largely diametrically deviated from the axis of the mandrel 6, the shock wave reflected by the outer peripheral surface of the mandrel 6 is not evenly applied to the coil 3, resulting in uneven compaction of the coil and hence failure to obtain a desired critical electric current density of the superconductive oxide powder within the coil 3.

However, strict tolerances are not required of the degree of alignment between the axes of the coil 3 and the mandrel 6, that is, practically inevitable alignment tolerances are permissible.

Examples of the method according to the invention will be given hereinbelow.

EXAMPLE 1

First, starting material powders were obtained, i.e. an yttrium oxide ($Y_2O_3$) powder, a barium carbonate ($BaCO_3$) powder, and a copper oxide (CuO) powder, which each have a mean particle size of 6 microns. The obtained powders were mixed in a molar ratio of $Y_2O_3$: $BaCO_3$: CuO=½: 2: 3.

The mixed powder was presintered in air at a temperature of 900° C. for 12 hours into a presintered body having a chemical composition $YBa_2Cu_3O_7$ with a perovskite structure (the Y-based oxide). The obtained presintered body of the Y-based oxide was crushed into a powder having a mean particle size of 1.3 microns.

The Y-based oxide powder was then charged into a tube formed of silver having a size of 20 mm in inner diameter, 1.5 mm in wall thickness, and 200 mm in length, and the silver tube thus charged with the Y-based oxide power was subjected to swaging, followed by being rolled with a grooved roll into a composite wire of silver and Y-based oxide, having a diameter of 2 mm. The composite wire of silver and Y-based oxide was coiled and cut into two coils, each having an inner diameter of 12 mm, one of which was placed into the cylindrical vessel 1 in FIG. 1, followed by subjecting the coil-charged vessel 1 to explosive compaction.

The explosive compaction was carried out in the following manner:

First, a bottomed cylindrical vessel 1 was prepared, which has a size of 30 mm in outer diameter, 26 mm in inner diameter, and 108 mm in length. The coil charged with the Y-based oxide was axially placed into the cylindrical vessel 1 at a central portion thereof, together with a SiC powder as the pressure medium 2 having a mean particle size of 2 microns. Then, the cylindrical vessel was vibrated to make the SiC powder denser and the SiC powder was additionally charged, followed by fitting a cap 4 into the vessel 1. Incidentally, the explosive compaction can be carried out even with the cap 4 omitted.

The completed cylindrical vessel 1 containing the coil 3 charged with the Y-based oxide was placed into a cardboard vessel 12 as shown in FIG. 3, and then a powdered explosive 10 (the detonation velocity: 2,300 m/s) was charged in an amount of 200 g. The entire vessel was exploded by the explosion triggering device 11 to carry out explosive compaction.

After the explosion, the coil 3 charged with the Y-based oxide was removed from the cylindrical vessel 1, thereby obtaining an explosively compacted coil.

Two coils, i.e., the coil charged with the Y-based oxide, which was explosively compacted, and coil charged with the Y-based oxide, which was not explosively compacted, were subjected to heat treatment under the same conditions, i.e., in an oxygen atmosphere at a temperature of 920° C. for 24 hours, to obtain a coil No. 1 according to the invention, which was explosively compacted, and a comparative coil No. 1′, which was not explosively compacted. The coil No. 1 and the coil No. 1′ had their superconductivities measured. The measurement results are shown in Table 1.

EXAMPLE 2

Starting material powders, i.e. a $Bi_2O_3$ powder, a $CaCO_3$ powder, a $SrCO_3$ powder, and a CuO powder were obtained, which each have a mean particle size of 10 microns or less. The prepared powders were mixed in a ratio by weight percent of the $Bi_2)_3$ powder: 53.4%, $CaCO_3$ powder: 11.5 %, $SrCO_3$ powder: 16.9%, and CuO powder: 18.2%. The mixed powder was sintered in air at a temperature of 800° C. for 12 hours into a sintered body, i.e., Bi-based oxide sintered body. The obtained Bi-based oxide sintered body was crushed into a powder having a mean particle size of 5 microns.

The Bi-based oxide powder was then charged into a tube formed of silver having a size of 20 mm in inner diameter, 1.5 mm in wall thickness, and 200 mm in length, and the tube charged with Bi-based oxide powder was subjected to swaging and then rolling with a grooved roll into a composite wire of silver and Bi-based oxide, having a diameter of 2 mm. The composite wire of silver and Bi-based oxide was coiled and cut into two coils, one of which was placed into the cylindrical vessel 1 in FIG. 1 and the vessel 1 was subjected to explosive compaction under the same explosion conditions as in Example 1.

After the explosion, the coil 3 charged with the Bi-based oxide was removed from the cylindrical vessel 1, thereby obtaining an explosively compacted coil.

Two coils, i.e., the coil charged with the Bi-based oxide, which was explosively compacted, and the coil charged with the Bi-based oxide, which was not explosively compacted, were subjected to heat treatment under the same conditions, i.e., in an oxygen atmosphere at a temperature of 850° C. for 15 hours, to obtain a coil No. 2 according to the invention, which was explosively compacted, and a comparative coil No. 2′, which was not explosively compacted. The coil No. 2 and the coil No. 2′ had their superconductivities measured. The measurement results are shown in Table 1.

EXAMPLE 3

Prepared as starting material powders were a $Tl_2O_3$ powder, a $CaCO_3$ powder, a $BaCO_3$ powder, and a CuO powder, which each have a mean particle size of 10 microns or less. The prepared powders were mixed in a ratio by weight percent of $Tl_2O_3$ powder: 35.4%, $CaCO_3$ powder: 15.5%, $BaCO_3$ powder: 30.6%, and CuO powder: 18.5%. The mixed powder was sintered in an oxygen atmosphere at a temperature of 800° C. for 10 hours into a Tl-based oxide sintered body. The obtained Tl-based oxide sintered body was crushed into a powder having a mean particle size of 5 microns.

The Tl-based oxide powder was then charged into a tube formed of silver having a size of 20 mm in inner diameter, 1.5 mm in wall thickness, and 200 mm in length, and the tube charged with Ti-based oxide powder was subjected to swaging and then rolling with a grooved roll into a composite wire of silver and Tl-based oxide, having a diameter of 2 mm. The composite wire of silver and Tl-based oxide was coiled and cut into two coils, one of which was placed into the cylindrical vessel 1 in FIG. 1, and the vessel 1 was subjected to explosive compaction, under the same conditions a in Example 1.

After the explosion, the coil charged with the Tl-based oxide was removed from the cylindrical vessel 1, thereby obtaining an explosively compacted coil.

Two coils, i.e., the coil charged with the Tl-based oxide, which was explosively compacted, and the coil charged with the Tl-based oxide, which was not explosively compacted, were subjected to heat treatment under the same conditions, i.e., in an oxygen atmosphere at a temperature of 900° C. for 3 hours, to obtain a coil No. 3 according to the invention, which was explosively compacted, and a comparative coil No. 3′, which was not explosively compacted. The coil No. 3 and the coil No. 3′ had their superconductivities measured. The measurement results are shown in Table 1.

EXAMPLE 4

Prepared as starting material powders were an yttrium oxide ($Y_2O_3$) powder, a barium carbonate ($BaCO_3$) powder, and a copper oxide (CuO) powder, which each have a mean particle size of 6 microns. The prepared powders were mixed in a molar ratio of $Y_2O_3$: $BaCO_3$ CuO=½: 2: 3. The mixed powder was presintered in an air atmosphere at a temperature of 900° C. for 12 hours into a presintered body having a chemical composition $YBa_2Cu_3O_7$ with a perovskite structure (the R-based oxide). The obtained presintered body of the R-based oxide was crushed into a powder having a mean particle size of 1.3 microns.

The R-based oxide powder was then charged into a tube formed of silver and having a size of 20 mm in inner diameter, 1.5 mm in wall thickness, and 200 mm in length, and the tube charged with R-based oxide powder was subjected to swaging and then rolling with a grooved roll into a composite wire of silver and R-based oxide having a diameter of 2 mm. The composite wire of silver and R-based oxide was coiled and cut into two coils, one of which was placed into the cylindrical vessel 1' in FIG. 4, and the vessel 1' was subjected to explosive compaction.

The explosive compaction was carried out in the following manner:

First, a cylindrical vessel 1' having opposite open ends was prepared, which has a size of 30 mm in outer diameter, 26 mm in inner diameter, and 108 mm in length. An end plug 9, which is formed of aluminum and has a size of 26 mm in outer diameter and 5 mm in thickness, was driven into a lower open end of the cylindrical vessel 1'. The end plug 9 has an axial central through bore 7 having a diameter of 8 mm formed therein. Inserted into the axial central through bore 7 of the end plug 9 was one end of a mandrel 6 which is formed of steel and has a size of 8 mm in outer diameter and 110 mm in length, on which a coil 3 charged with the R-based superconductive oxide was temporarily fixed by the use of an adhesive. Then, a SiC powder as the pressure medium having a mean particle size of 2 microns was charged into a space between the cylindrical vessel 1' and the mandrel 6. Then the cylindrical vessel 1' was vibrated to make the SiC powder denser, followed by additionally charging the SiC powder. A cap 4 formed of aluminum and having a size of 30 mm in outer diameter and 5 mm in thickness was fitted into the cylindrical vessel 1' at the other open end thereof. The cap 4 has an axial through bore 8 with a diameter of 8 mm formed therein, into which the other end of the mandrel 6 was inserted.

The completed cylindrical vessel 1' containing the coil 3 charged with the R-based oxide was placed into a cardboard vessel 12, and then a powdery explosive 10 (the detonation velocity: 2,300 m/s) was charged in an amount of 200 g. The entire vessel was exploded by the explosive triggering device 11 to carry out explosive compaction.

After the explosion, the coil 3 charged with the R-based oxide was removed from the cylindrical vessel 1', thereby obtaining an explosively compacted coil.

Two coils, i.e., the coil charged with the R-based oxide, which was explosively compacted, and the coil charged with the R-based oxide, which was not explosively compacted, were subjected to heat treatment under the same conditions, i.e., in an oxygen atmosphere at a temperature of 920° C. for 24 hours, to obtain a coil No. 4 according to the invention, which was explosively compacted, and a comparative coil No. 4', which was not explosively compacted. The coil No. 4 and the coil No. 4' had their superconductivities measured. The measurement results are shown in Table 1.

EXAMPLE 5

Starting material powders, i.e., a $Bi_2O_3$ powder, a $CaCO_3$ powder, a $SrCO_3$ powder, and a CuO powder were prepared, which each have a mean particle size of 10 microns or less. The prepared powders were mixed in a ratio by weight percent of the $Bi_2O_3$ powder 53.4%, $CaCO_3$ powder: 11.5%, $SrCO_3$ powder: 16.9%, and CuO powder: 18.2%. The mixed powder was sintered in an air atmosphere at a temperature of 800° C. for 12 hours into a sintered body, i.e., Bi-based oxide sintered body. The obtained Bi-based oxide sintered body was crushed into a powder having a mean particle size of 5 microns.

The Bi-based oxide powder was then charged into a tube formed of silver having a size of 20 mm in inner diameter, 1.5 mm in wall thickness, and 200 mm in length, and the tube charged with Bi-oxide powder was subjected to swaging and then rolling with a grooved roll into a composite wire of silver and Bi-based oxide having a diameter of 2 mm. The composite wire of silver and Bi-based oxide was coiled and cut into two coils, one of which was placed into the cylindrical vessel 1' in FIG. 4 and the vessel 1' was subjected to explosive compaction under the same explosion conditions as in Example 4.

After the explosion, the coil 3 charged with the Bi-based oxide was removed from the cylindrical vessel 1', thereby obtaining an explosively compacted coil.

Two coils, i.e., the coil charged with the Bi-based oxide, which was explosively compacted, and the coil charged with the Bi-based oxide, which was not explosively compacted, were subjected to heat treatment under the same conditions, i.e., in an oxygen atmosphere at a temperature of 850° C. for 15 hours to obtain a coil No. 5 according to the invention, which was explosively compacted, and a coil No. 5', which was not explosively compacted. The coil No. 5 and the coil No. 5' had their superconductivities measured. The measurement results are shown in Table 1.

EXAMPLE 6

Prepared as starting material powders were a $Tl_2O_3$ powder, a $CaCO_3$ powder, a $BaCO_3$ powder, and a CuO powder, which each have a mean particle size of 10 microns or less. The prepared powders were mixed in a ratio by weight percent of the $Tl_2O_3$ powder: 35.4%, $CaCO_3$ powder: 15.5%, $BaCO_3$ powder: 30.6%, and CuO powder: 18.5%. The mixed powder was sintered in an oxygen atmosphere at a temperature of 800° C. for 10 hours into a Tl-based oxide sintered body. The obtained Tl-based oxide sintered body was crushed into a powder having a mean particle size of 5 microns.

The Tl-based oxide powder was then charged into a tube formed of silver having a size of 20 mm in inner diameter, 1.5 mm in wall thickness, and 200 mm in length, and the tube charged with Ti-based oxide powder was subjected to swaging and then rolling with a grooved roll into a composite wire of silver and Tl-based oxide, having a diameter of 2 mm. The composite wire of silver and Tl-based oxide was coiled and cut into two coils, one of which was placed into the cylindrical vessel 1' in FIG. 4, and the vessel 1' was subjected to explosive compaction, under the same conditions as in Example 4.

TABLE 1

| | | SUPERCONDUCTIVE OXIDE CHARGED WITHIN COIL | EXPLOSIVE COMPACTION | SUPERCONDUCTIVITY | |
|---|---|---|---|---|---|
| | | | | CRITICAL ELECTRIC CURRENT DENSITY ($A/cm^2$) | CRITICAL TEMPERATURE (°K.) |
| SUPERCONDUTIVE COIL ACCORDING TO THE INVENTION | 1 | Y-BASED OXIDE | CARRIED OUT | 17,000 | 94 |
| COMPARATIVE COIL | 1' | | NOT CARRIED | 600 | 93 |

TABLE 1-continued

| | | SUPERCONDUCTIVE OXIDE CHARGED WITHIN COIL | EXPLOSIVE COMPACTION | SUPERCONDUCTIVITY | |
|---|---|---|---|---|---|
| | | | | CRITICAL ELECTRIC CURRENT DENSITY (A/cm$^2$) | CRITICAL TEMPERATURE (°K.) |
| SUPERCONDUCTIVE COIL ACCORDING TO THE INVENTION | 2 | Bi-BASED OXIDE | CARRIED OUT | 1,800 | 102 |
| COMPARATIVE COIL | 2' | | NOT CARRIED OUT | 70 | 102 |
| SUPERCONDUCTIVE COIL ACCORDING TO THE INVENTION | 3 | Tl-BASED OXIDE | CARRIED OUT | 5,500 | 110 |
| COMPARATIVE COIL | 3' | | NOT CARRIED OUT | 140 | 108 |
| SUPERCONDUCTIVE COIL ACCORDING THE INVENTION | 4 | R-BASED OXIDE* | CARRIED OUT | 19,000 | 93 |
| COMPARATIVE COIL | 4' | | NOT CARRIED OUT | 550 | 93 |
| SUPERCONDUCTIVE COIL ACCORDING TO THE INVENTION | 5 | Bi-BASED OXIDE | CARRIED OUT | 2,100 | 102 |
| COMPARATIVE COIL | 5' | | NOT CARRIED OUT | 60 | 101 |
| SUPERCONDUCTIVE COIL ACCORDING TO THE INVENTION | 6 | Tl-BASED OXIDE | CARRIED OUT | 5,400 | 110 |
| COMPARATIVE COIL | 6' | | NOT CARRIED OUT | 120 | 109 |

*R DENOTES RARE EARTH ELEMENT (S) AND/OR YTTRIUM

After the explosion, the coil charged with the Tl-based oxide was removed from the cylindrical vessel 1', thereby obtaining an explosively compacted coil.

Two coils, i.e., the coil charged with the Tl-based oxide, which was explosively compacted, and the coil charged with the Tl-based oxide, which was not explosively compacted, were subjected to heat treatment under the same conditions, i.e., in an oxygen atmosphere at a temperature of 900° C. for 15 hours, to obtain a coil No. 6 according to the invention, which was explosively compacted, and a comparative coil No. 6', which was not explosively compacted. The coil No. 6 and the coil No. 6' had their superconductivities tested and measured. The measurement results are shown in Table 1.

As is apparent from Table 1, the superconductive coils Nos. 1–6 manufactured by the method according to the invention all showed by far superior values of superconductivity to the comparative coils 1'–6' not subjected to explosive compaction. Further, the superconductive coils No. 4–6, which were manufactured through explosive compaction by the use of the mandrel showed further improved superconductivity.

What is claimed is:

1. In a method of manufacturing a superconductive coil by means of explosive compaction by forming into a coil a tubular wire formed of silver having a superconductive oxide powder charged therein, subjecting said coil to explosive compaction to densify said coil, and heat-treating said coil thus densified in an air or oxygen atmosphere,
   the improvement comprising the steps of:
   (1) placing said coil within a cylindrical vessel and charging a pressure medium comprising a non-compacting powder which is not solidified by said explosive compaction or a fluid, into said cylindrical vessel; and
   (2) carrying out said explosive compaction to cause compaction of said coil by the action of a shock wave traveling through said cylindrical vessel and said pressure medium and hence densify said coil.

2. The method as claimed in claim 1, wherein said coil is placed within said cylindrical vessel at a central location thereof.

3. The method as claimed in claim 1, wherein said pressure medium comprises said non-compacting powder and said non-compacting powder has a mean particle size of 1 to 1000 microns.

4. The method as claimed in claim 1, wherein said pressure medium comprises said fluid.

5. The method as claimed in claim 1, wherein said superconductive oxide powder is a powder of an oxide having a perovskite structure formed of at least one of rare earth elements and yttrium, at least one of alkali earth metals, copper, and oxygen.

6. The method as claimed in claim 1, wherein said superconductive oxide powder is a powder of Bi-Ca-Sr-Cu-O oxide.

7. The method as claimed in claim 1, wherein said superconductive oxide powder is a powder of Tl-Ca-ba-Cu-O oxide.

8. The method as claimed in claim 1, wherein said cylindrical vessel is formed of one material selected from the group consisting of metal, an alloy thereof, synthetic resin, glass, ceramic, and cardboard.

9. In a method of manufacturing a superconductive coil by means of explosive compaction by forming into a coil a tubular wire formed of silver having a superconductive oxide powder charged therein, carrying out explosive compaction to densify said coil, and heat-treating said coil thus densified in an air of oxygen atmosphere,
   the improvement comprising the steps of:
   (1) mounting said coil on a mandrel axially extending therethrough, said mandrel having a smaller diameter than an inner diameter of said coil;
   (2) placing said coil mounted on said mandrel within a cylindrical vessel and charging a pressure medium comprising a non-compacting powder which is not solidified by said explosive compaction or a fluid, into said cylindrical vessel; and (3) carrying out said explosive compaction to cause compaction of said coil by the action of a shock wave traveling through said cylindrical vessel, said pressure medium, and said mandrel, and hence densify said coil.

10. The method as claimed in claim 9, wherein said coil is placed within said cylindrical vessel such that said coil has an axis thereof in alignment with axes of said mandrel and said vessel.

11. The method as claimed in claim 9, wherein said pressure medium comprises said non-compacting powder and said non-compacting powder has a mean particle size of 1 to 1000 microns.

12. The method as claimed in claim 9 wherein said pressure medium comprises said fluid.

13. The method as claimed in claim 9, wherein said mandrel is formed of metal.

14. The method as claimed in claim 9, wherein said mandrel is formed of ceramic.

15. The method as claimed in claim 9, wherein said superconductive oxide powder is a powder of an oxide having a perovskite structure formed of at least one of rare earth elements and yttrium, at least one of alkali earth metals, copper, and oxygen.

16. The method as claimed in claim 9, wherein said superconductive oxide powder is a powder of Bi-Ca-Sr-Cu-O oxide.

17. The method as claimed in claim 9, wherein said superconductive oxide powder is a powder of Tl-Ca-Ba-Cu-O oxide.

18. The method as claimed in claim 9, wherein said cylindrical vessel is formed of one material selected from the group consisting of metal, an alloy thereof, synthetic resin, glass, ceramic, and cardboard.

* * * * *